United States Patent
Hamilton et al.

(10) Patent No.: US 7,038,948 B2
(45) Date of Patent: May 2, 2006

(54) READ APPROACH FOR MULTI-LEVEL VIRTUAL GROUND MEMORY

(75) Inventors: Darlene Hamilton, San Jose, CA (US); Fatima Bathul, Cupertino, CA (US); Masato Horiike, Sunnyvale, CA (US); Eugen Gershon, San Jose, CA (US); Michael Van Buskirk, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/946,809

(22) Filed: Sep. 22, 2004

(65) Prior Publication Data

US 2006/0062054 A1    Mar. 23, 2006

(51) Int. Cl.
 *G11C 16/04*    (2006.01)

(52) U.S. Cl. .............................. 365/185.2; 365/185.18; 365/185.24; 365/189.07

(58) Field of Classification Search .............. 365/185.2, 365/185.24, 189.07, 185.18, 195.18
See application file for complete search history.

(56) References Cited

U.S. PATENT DOCUMENTS

| | | | |
|---|---|---|---|
| 5,629,892 A * | 5/1997 | Tang ....................... | 365/185.2 |
| 5,999,451 A | 12/1999 | Lin et al. | |
| 6,317,364 B1 | 11/2001 | Guterman et al. | |
| 6,462,986 B1 | 10/2002 | Khan | |
| 6,504,398 B1 | 1/2003 | Lien et al. | |
| 6,512,701 B1 | 1/2003 | Hamilton et al. | |
| 6,584,017 B1 | 6/2003 | Maayan et al. | |
| 6,684,173 B1 * | 1/2004 | Kessenich et al. .......... | 702/117 |
| 6,700,815 B1 | 3/2004 | Le et al. | |
| 6,700,818 B1 | 3/2004 | Shappir et al. | |

* cited by examiner

*Primary Examiner*—Son T. Dinh
(74) *Attorney, Agent, or Firm*—Eschweiler & Associates, LLC

(57) ABSTRACT

The present invention pertains to a technique for determining the level of a bit in a dual sided ONO flash memory cell where each of the bits of the dual sided ONO flash memory cell can be programmed to multiple levels. One or more aspects of the present invention take into consideration the affect that the level of charge on one bit can have on the other bit, otherwise known as complimentary bit disturb. A metric known as transconductance is utilized in making the bit level determination to provide a greater degree of resolution and accuracy. In this manner, determining the bit level in accordance with one or more aspects of the present invention mitigates false or erroneous reads.

23 Claims, 8 Drawing Sheets

| LEFT BIT STATUS | RIGHT BIT STATUS | LEFT BIT | RIGHT BIT | READ LEFT BIT CASE | READ RIGHT BIT CASE |
|---|---|---|---|---|---|
| BLANK | BLANK | 1 | 1 | 11 | 11 |
| BLANK | LEVEL 2 | 1 | 2 | 12 | 21 |
| BLANK | LEVEL 3 | 1 | 3 | 13 | 31 |
| BLANK | LEVEL 4 | 1 | 4 | 14 | 41 |
| LEVEL 2 | BLANK | 2 | 1 | 21 | 12 |
| LEVEL 2 | LEVEL 2 | 2 | 2 | 22 | 22 |
| LEVEL 2 | LEVEL 3 | 2 | 3 | 23 | 32 |
| LEVEL 2 | LEVEL 4 | 2 | 4 | 24 | 42 |
| LEVEL 3 | BLANK | 3 | 1 | 31 | 13 |
| LEVEL 3 | LEVEL 2 | 3 | 2 | 32 | 23 |
| LEVEL 3 | LEVEL 3 | 3 | 3 | 33 | 33 |
| LEVEL 3 | LEVEL 4 | 3 | 4 | 34 | 43 |
| LEVEL 4 | BLANK | 4 | 1 | 41 | 14 |
| LEVEL 4 | LEVEL 2 | 4 | 2 | 42 | 24 |
| LEVEL 4 | LEVEL 3 | 4 | 3 | 43 | 34 |
| LEVEL 4 | LEVEL 4 | 4 | 4 | 44 | 44 |

Fig. 6

READ APPROACH FOR MULTI-LEVEL VIRTUAL GROUND MEMORY

RELATED APPLICATIONS

This application is related to U.S. patent application Ser. No. 10/951,410, filed on Sep. 28, 2004, entitled SYSTEM THAT FACILITATES READING MULTI-LEVEL DATA IN NON-VOLATILE MEMORY, the entirety of which is hereby incorporated by reference as if fully set forth herein.

FIELD OF INVENTION

The present invention relates generally to memory for electronic systems and the like, and in particular to a technique for reading stored charges and determining the status of bits of data represented thereby.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc. Flash memory is generally constructed of many memory cells where single bits of data are stored in and read out of respective memory cells.

Individual memory cells are generally organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

A relatively modern memory technology is dual sided ONO flash memory, which allows multiple bits to be stored in a single cell. In this technology, a memory cell is essentially split into two identical (mirrored) parts, each of which is formulated for storing one of two independent bits. Each dual sided ONO flash memory cell, like a traditional cell, has a gate with a source and a drain. However, unlike a traditional stacked gate cell in which the source is always connected to an electrical source and the drain is always connected to an electrical drain, respective dual sided ONO flash memory cells can have the connections of the source and drain reversed during operation to permit the storing of two bits.

In a virtual ground type architecture, dual sided ONO flash memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto individual semiconductor wafers (or die).

One technique to pack more memory cells/transistors into a smaller area is to form their structures and component elements closer together. Forming bitlines closer together, for example, shortens the length of a channel defined therebetween and allows more devices to be formed in the same area. This can, however, cause certain undesirable phenomena to become more prevalent. For example, isolating two bits or charges stored within a charge trapping layer becomes increasingly difficult as the channel length is decreased and the bits are brought closer together. In this manner, the bits or charges can contaminate one another, causing operations to be performed on the bits to be more challenging and introducing a greater opportunity for error. The affect that bits can have on one another is sometimes referred to complimentary bit disturb or CBD. Accordingly, it would be desirable to be able to operate on, and in particular, to read charges from a charge trapping layer in a manner that facilitates a more accurate determination of the status of stored bits.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to a technique for determining the level or value of a bit in a multi-level dual sided ONO flash memory cell where each side or bits of the memory cell can be programmed to multiple target values or levels. One or more aspects of the present invention consider the affect that the amount of charge on one side of the cell can have on the other bit, otherwise known as complimentary bit disturb. A metric known as transconductance is utilized in making the bit level determination to provide a greater degree of resolution and accuracy. In this manner, determining the bit level in accordance with one or more aspects of the present invention mitigates false or erroneous reads.

According to one or more aspects of the present invention, a method of determining a programmed level of a bit of a core memory cell is disclosed. The method includes comparing a transconductance value for the bit of the cell to a plurality of reference transconductance values corresponding to possible levels of the bit, and determining the level of the bit based upon the comparison.

According to one or more other aspects of the present invention, a method of determining a level of a bit of a core dual sided ONO flash memory cell is disclosed. The method includes determining whether the bit is blank or a level 1 by making an un-programmed comparison of a core current for the bit to a blank reference current corresponding to a situation where the bit is a level 1 or un-programmed. The method also includes making a slope comparison of a core current slope for the bit to a plurality of reference current slopes corresponding to possible levels of the bit if the bit is programmed. Finally, the level of the bit is determined based upon the slope comparison.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 6 is a chart of possible combinations for a dual sided ONO flash memory cell where each of the bits can be stored at four (4) different levels.

DETAILED DESCRIPTION OF THE INVENTION

Figure 1:
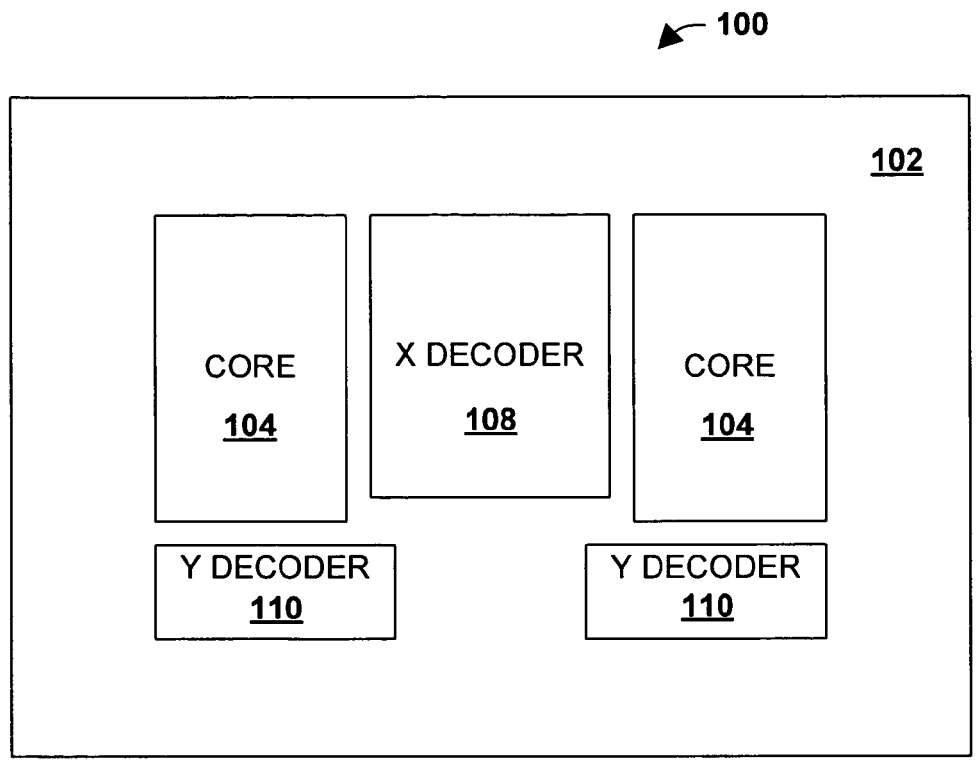
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to a technique for determining the level of a bit in a dual sided ONO flash memory cell where each of the bits of the dual sided ONO flash memory cell can be programmed to multiple levels. One or more aspects of the present invention consider the affect that the level of charge on one bit can have on the other bit, otherwise known as complimentary bit disturb. A metric of transconductance is utilized in making the bit level determination to provide a greater degree of resolution and accuracy. In this manner, determining the bit level in accordance with one or more aspects of the present invention mitigates false or erroneous reads.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include programming circuitry for selectively addressing the individual memory cells. The programming circuitry is represented in part by and includes one or more x-decoders 108 and one or more y-decoders 110 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
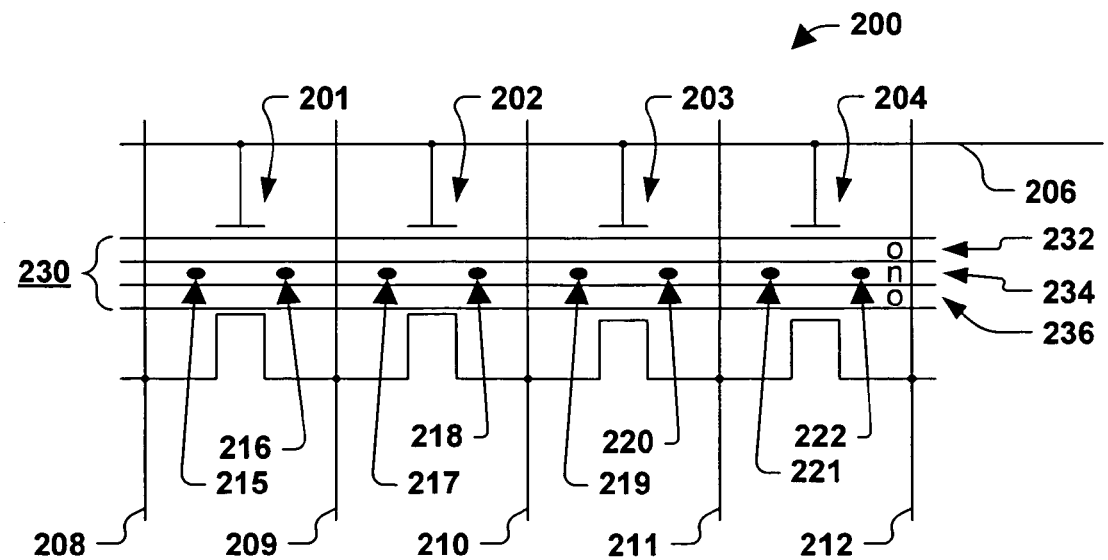
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon wordline voltages and bitline connections, the memory cells 201 through 204 are capable of writing, reading, and erasing bits at locations 215 through 222. In addition to voltages applied to the wordline 206, reading the bit at location 215, for example, is achieved through connection of the drain to the bitline 209 and the source to the bitline 208. During programming, bitline 208 serves as the drain while 209 serves as the source. Similarly, reading of the bit at location 216 is achieved through connection of the drain to the bitline 208 and the source to the bitline 209. Storage of multiple bits is made possible, at least in part, by a charge trapping dielectric layer 230 interposed between the bitlines and the wordline. The charge trapping dielectric layer 230 includes multiple insulating layers 232, 236 (e.g., of oxide based material) that sandwich a charge trapping layer 234 (e.g., of nitride based material). Given its layer to layer composition, the charge trapping dielectric layer 230 is often referred to as an ONO layer.

The ONO layer 230 allows the different bits to be stored at multiple states or levels as well. For example, depending upon the voltage applied to the memory cells 201 through 204 by the control gate or wordline 206 during programming, varying amounts of charge can be stored at locations 215 through 222. The different amounts of charge may correspond to different bit states or levels, for example. If four different charge levels (e.g., 1, 2, 3 and 4) can be stored at each of the bit locations 215 through 222, for example, then each two-bit cell 201 through 204 can have 16 different combinations of stored data (e.g., 1×levels: 1-1, 1-2, 1-3, 1-4; 2×levels: 2-1, 2-2, 2-3, 2-4; 3×levels: 3-1, 3-2, 3-3, 3-4; 4×levels: 4-1, 4-2, 4-3 and 4-4).

Figure 3:
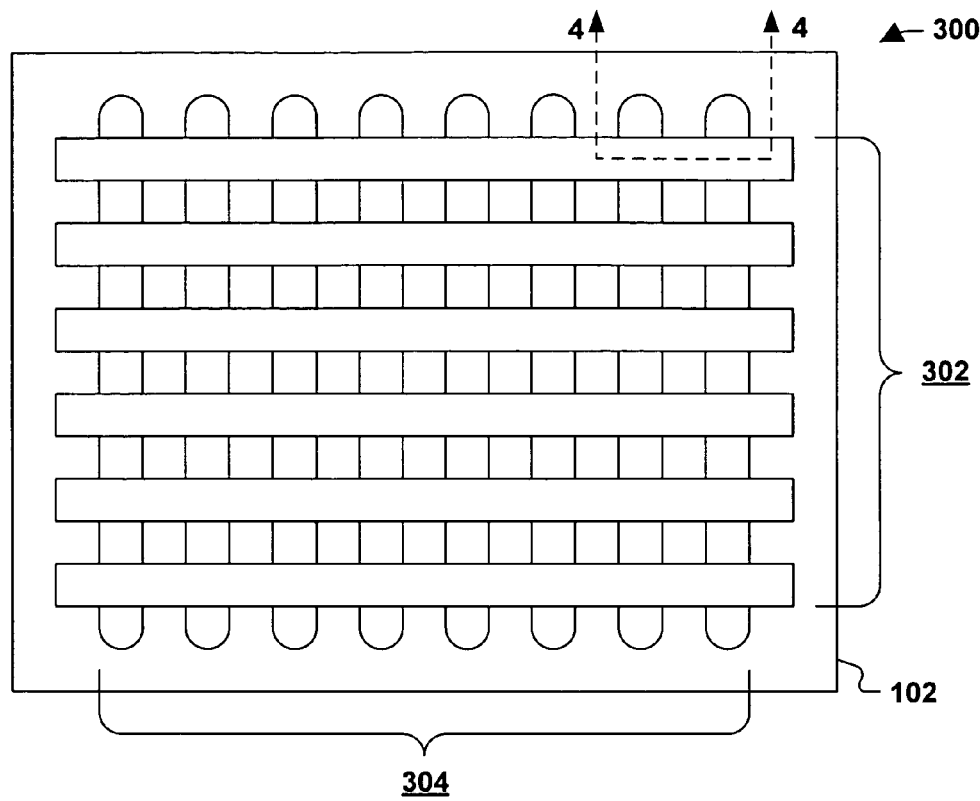
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
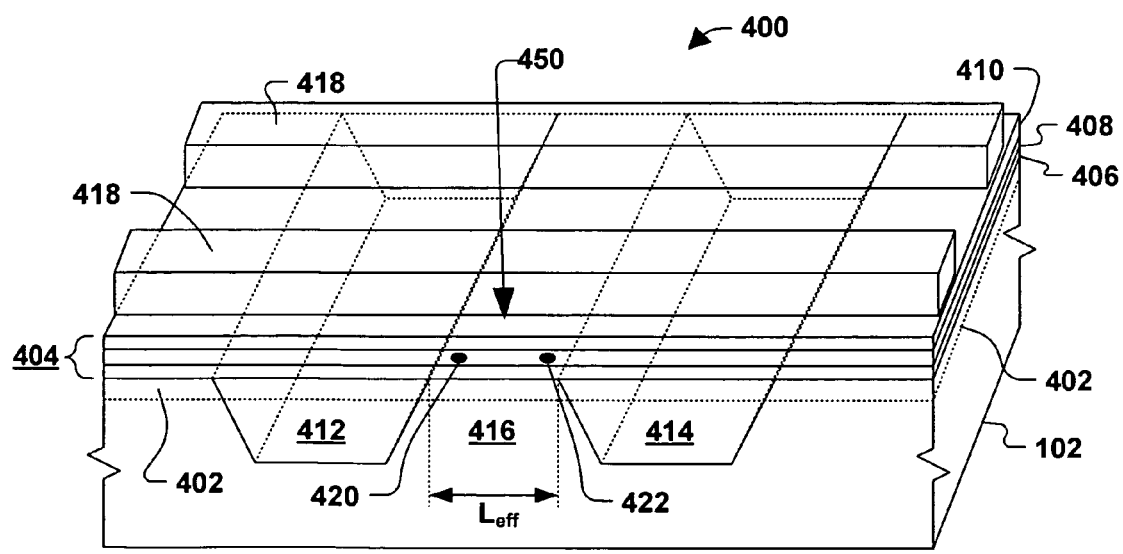
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3, and 208 through 212 depicted in FIG. 2. The bitlines are typically formed of an implanted n-type material, such as arsenic, and may include an oxide portion (not shown) in some examples. The first and second conductive bitlines 412 and 414 are spaced apart by an effective length ($L_{eff}$) and define a channel region 416 there-between.

Conductive wordlines 418 are similarly depicted overlying the charge-trapping dielectric layer 404. It will be appreciated that any number of such wordlines can be formed over the dielectric layer 404, and that such wordlines may correspond to the wordlines 302 depicted in FIG. 3, and 206 depicted in FIG. 2. The wordlines can be formed out of a polysilicon material, for example, where the polysilicon material may be deposited over the dielectric layer 404 and then patterned and etched.

Locations 420 and 422 indicate generally where respective charges or bits of data can be stored in one of the cells of the memory 400, and these locations may, for example, correspond to locations 215 through 222 in FIG. 2. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. Accordingly, the degree to which the memory can be scaled, yet perform as desired, may be limited in some cases.

A dual sided ONO flash memory cell 450 is thus defined within the arrangement 400. It will be appreciated that such a memory cell may correspond to memory cells 201 through 204 depicted in FIG. 2, for example. It will be further appreciated that the charge-trapping dielectric layer 404, and more particularly the charge-trapping layer 408, may, for example, enable multiple levels or bit states to be stored at locations 420 and 422. The charge trapping layer 408 makes this possible because it is non-conductive and, thus, any charge instilled therein (e.g., via application of a wordline voltage) remains substantially localized at positions 420 and 422. This allows the memory cell 450, and correspondingly an array of such cells, to store an increased amount of data. For example, if four different charges (e.g., 1, 2, 3 and 4) can be stored at each of the two bit locations 420, 422, the cell 450 can have 16 different bit states (e.g., 1-1, 1-2, 1-3, 1-4, 2-1, 2-2, 2-3, 2-4, 3-1, 3-2, 3-3, 3-4, 4-1, 4-2, 4-3 and 4-4).

Figure 5:
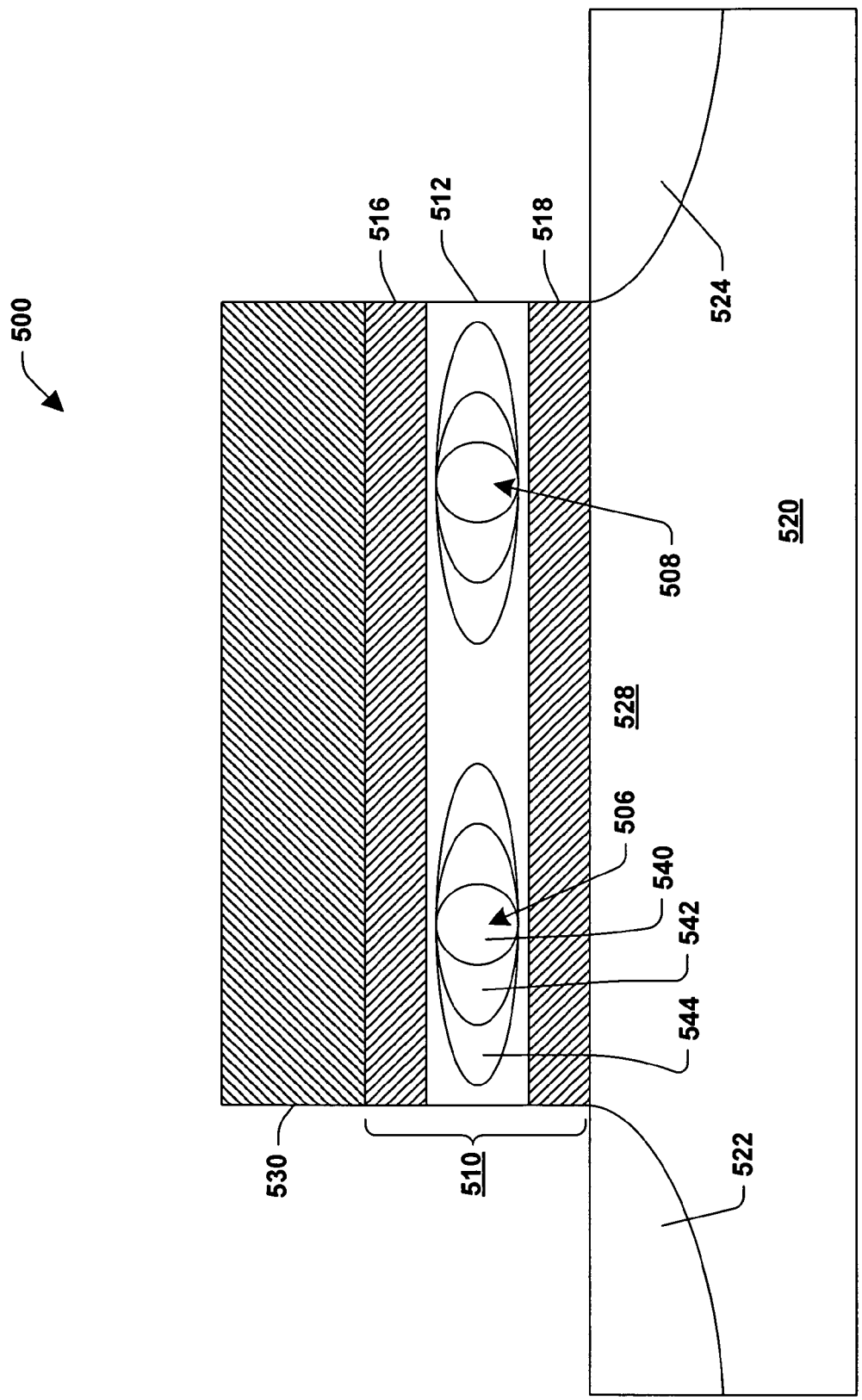
FIG. 5 is a cross-sectional view of a dual sided ONO flash memory cell wherein each of the bits can be stored at multiple levels.

FIG. 5 is a cross sectional view of a dual sided ONO flash memory cell 500 illustrating the capability of the cell to store varying degrees of charge at dual bit locations 506, 508. It will be appreciated that the memory cell 500 may, for example, correspond to the memory cells 201 through 204 depicted in FIG. 2, and the memory cell 450 depicted in FIG.

4. The cell 500 includes a charge trapping dielectric layer 510 that comprises a charge trapping layer 512 sandwiched between two dielectric layers 516, 518. The charge trapping layer 512 is formed from one or more substantially non-conductive substances, such as nitride based materials. The dielectric layers 516, 518 are similarly formed from one or more electrically insulating substances, such as oxide based materials. The layer to layer arrangement of the charge trapping dielectric layer 510 often leads it to be referred to as an ONO layer.

The charge trapping layer 510 is formed over a substrate 520 that may be formed from silicon or some other semiconductor material, for example. The substrate 520 may be selectively doped with a p-type dopant, such as boron, for example, to alter its electrical properties. In the example illustrated, the substrate 520 has buried bitlines or bitline diffusions including a first bitline diffusion 522 and a second bitline diffusion 524. The bitline diffusions 522 and 524 may, for example, be formed by an implanted n-type dopant, and may correspond to bitlines 208 through 212 in FIG. 2, and buried bitlines 412 and 414 in FIG. 4. A channel 528 is defined within the substrate between the first 522 and second 524 bitline diffusions.

Overlying the upper dielectric layer 516 of the charge trapping dielectric layer 510 is a gate 530. This gate 530 may be formed from a polysilicon material, for example, and may be doped with an n-type impurity (e.g., phosphorus) to alter its electrical behavior. The gate may, for example, correspond to the wordlines 206 in FIG. 2, and 418 in FIG. 4. The gate 530 enables a voltage to be applied to the cell 530 such that respective charges can, among other things, be stored within the cell at locations 506, 508, depending upon the electrical connections of the bitline diffusions 522, 524.

The dual sided ONO flash memory cell 500 is generally symmetrical, thus the bitline diffusions 522 and 524 are interchangeable as acting source and drain. Thus, the first bitline diffusion 522 may serve as the source and the second bitline diffusion 524 as the drain with respect to right bit location 508 for program. Likewise, the second bitline diffusion 524 may serve as the source and the first bitline diffusion 522 as the drain for the left bit location 506 for program. The cell 500 can be programmed by applying a voltage across the gate 530 and an acting drain region and connecting an acting source region to ground.

When programming the cell 500, the acting drain region is typically biased to a potential above the acting source. As a result of the gate bias, a high electric field is applied across the charge trapping layer 512. Due to a phenomenon known as "hot electron injection", electrons pass from the acting source region through the lower dielectric layer 518 and become trapped in the charge trapping layer 512 at locations 506 or 508. It will be appreciated that a second bit can be programmed to the alternate location 508 or 506 by reversing the acting source and drain and again applying a bias to the control gate 530.

By way of example, the left bit location 506 can be programmed by applying a program voltage to the gate 530 and a drain voltage to the second bitline 522, which is an acting drain for the left location 506. The first bitline 524, which is an acting source for programming the left bit location 506, can be connected to ground, or biased to a different voltage level. The applied voltages generate a vertical electric field through the dielectric layers 518 and 516 and also through the charge trapping layer 512, and generate a lateral electric field across a length of the channel 528 from the first bitline diffusion 522 to the second bitline diffusion 524. At a given voltage, the channel 528 inverts such that electrons are drawn off the acting source (the first bitline diffusion 524 in this example) and begin accelerating towards the acting drain (the second bitline diffusion 522 in this example).

As the electrons move along the length of the channel 528, the electrons gain energy and, upon attaining enough energy, the electrons jump over the potential barrier of the bottom dielectric layer 518 and into the charge trapping layer 512, where the electrons become trapped. The probability of electrons jumping the potential barrier in this arrangement is a maximum in the area of the left bit location 506, adjacent the first bitline diffusion 522, where the electrons have gained the most energy. These accelerated electrons are termed hot electrons and, once injected into the charge trapping layer 512, stay in about the general area indicated for the left bit. The trapped electrons tend to remain generally localized due to the low conductivity of the charge trapping layer 512 and the low lateral electric field therein. Programming the right bit location 508 is similar, but the first bitline 524 operates as an acting drain and the second 522 operates as an acting source.

For a read operation, a certain voltage bias is applied across an acting drain to an acting source of the cell 500. The acting drain of the cell is a bitline, which may be connected to the drains of other cells in a byte or word group. A voltage is then applied to the gate 530 (e.g., the wordline) of the memory cell 500 in order to cause a current to flow from the acting drain to the acting source. The resulting current is measured, by which a determination is made as to the value of the data stored in the cell. For example, if the current is above a certain threshold, the bit is deemed unprogrammed or a logical one, whereas if the current is below a certain threshold, the bit is deemed to be programmed or a logical zero. A second bit can be read by reversing operations of the first and second bitline diffusions 522 and 524 for the acting drain and the acting source.

It can be appreciated that if the voltages utilized to program the left 506 and right 508 bit locations of the cell 500 are increased or sustained for longer periods of time, the number of electrons or amount of charge stored at these locations can be increased or otherwise varied. This allows the cell 500 to be utilized for additional data storage. For example, different amounts of charge can correspond to different programmed states. In the example illustrated, for instance, both the left 506 and right 508 bit locations can be said to have four different states or levels, namely 1, 2, 3 and 4, where level 1 corresponds to a situation where the locations are blank or un-programmed, and levels 2, 3 and 4 correspond to increased amounts of stored charge, respectively. With regard to the left bit location 506, for example, a level 2 may correspond to a relatively small amount of stored charge 540, while levels 3 and 4 may correspond to increasingly larger amounts of stored charge 542 and 544, respectively.

FIG. 6 is a chart 600 corresponding to such a situation where the left and right bits of a memory cell may each be one of four different states. In particular, a first column 602 of the chart 600 illustrates the status of the left bit at different programmed configurations, while a second column 604 illustrates the status of the right bit at the same programmed configurations for the cell. A third column 606 depicts what the left bit actually is, while a fourth column 608 depicts what the right bit actually is. This may, for example, correspond to logic levels for the bits. Finally, a fifth column 610 depicts a case where reading is from the left, while a sixth column 612 depicts a case where reading is from the right.

With reference back to FIG. 5, it can be appreciated that the quantity of charge stored in the respective locations 506 and 508 influences the amount of current that flows between the acting source 522, 524 and the acting drain 524, 522 during a read operation, as well as the threshold voltage (Vt) required to cause such current to flow. Thus, the level of stored bits can be determined by examining drain to source currents as well as corresponding applied threshold gate (wordline) voltages. In particular, low currents and high gate voltages may be indicative of higher and higher bit levels. Thus, measured currents and/or threshold voltages that fall within first, second, third or fourth ranges may, for example, be indicative of a level 1, level 2, level 3 or level 4, respectively for the stored bit.

It can be further appreciated, however, that even though the charge trapping layer 512 is substantially non-conductive and electrons trapped therein remain substantially localized within regions 506 or 508, the effects of complimentary bit disturb can manifest to a greater degree where dual bits can be programmed to different levels, such as 540, 542 and 544. For example, if left bit location 506 is un-programmed (level 1) or is only slightly programmed (level 2) and right bit location 508 is highly programmed (level 4), then some of the charge utilized to program the right bit may decrease the current from the left bit, causing the left bit to read a higher level than intended, or rather causing the threshold voltage necessary to read the left bit to be inflated such that this Vt is more indicative of a level 3 rather than the actual level 1 or level 2 of the left bit. Similarly, the charge on the left bit may cause the right bit to read a lower current than intended, or rather cause the threshold voltage necessary to read the right bit to be inflated such that this Vt is more indicative of a higher Vt level bit.

Figure 7:
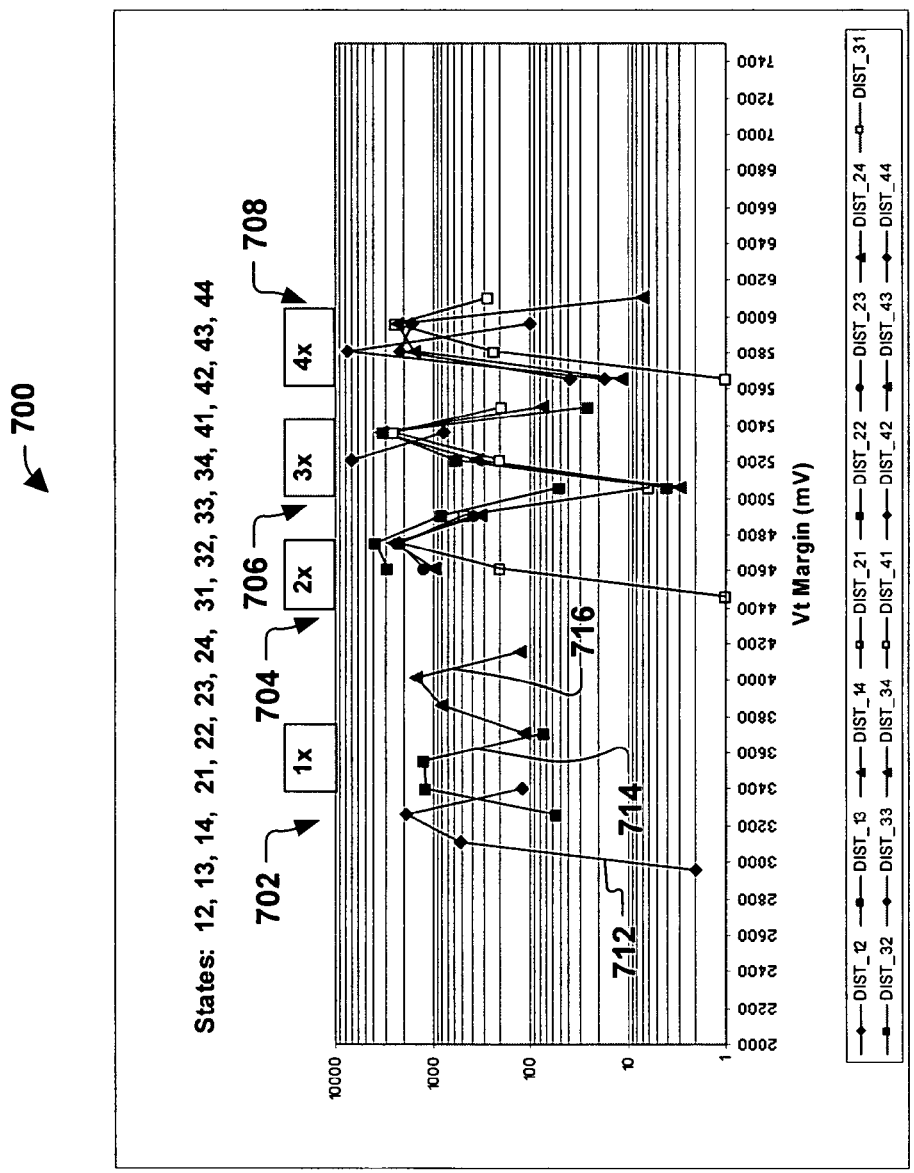
FIG. 7 is a graph illustrating threshold voltage distributions for an array of cells and the affect that dual bits can have on one another, particularly where the bits are stored at different levels.

FIG. 7 is a graph 700 that illustrates such a situation where dual bits within a cell can be programmed to four different levels, and where the charges on the cells can affect one another. A threshold voltage (Vt) margin for a first or left bit as measured in milli-volts (mV) is plotted on the x-axis, while the distribution or number of occurrences for particular Vt's is plotted on the y-axis on a logarithmic scale. The graph 700 includes four different exemplary groupings of curves 702, 704, 706, 708 corresponding to the four different levels to which the first or left bit can be programmed. Each of the groupings contains a plurality of curves that reveal the shift in Vt for the left bit as the level of the right bit is altered (e.g., increased).

For example, grouping 702 includes three curves 712, 714, 716 that correspond to program states of 1-2, 1-3 and 1-4, respectively, which may correspond to the left bit being blank and the right bit being programmed to three different states, for example. It can be seen that as the right bit is programmed harder, a range of values of Vt for the left bit (which remains at a (blank) level 1 in all of the curves 712, 714, 716 in grouping 702) increases. In curve 712, for example, where the first or left bit is programmed to a level 1 and the second or right bit is programmed to a level 2 (e.g., 1-2), the value of Vt for the left bit falls within a range of between about 3000 to about 3500 milli-volts blank Vt(blank threshold Vt). In curve 716, however, where the right bit is programmed to level 4 (e.g., 1-4), the range of Vt values for the left bit is shifted upwards and is higher than the original blank Vt. This shift in Vt for the left bit is a function of the change in threshold Vt (delta Vt=program Vt for level 4−blank Vt) of the right bit (which is programmed to level 4), or is equal to Vt blank+a function of program deltaVt level of right bit (which is level 4).

It can be appreciated that, while not as dramatic, similar shifts occur where the left bit is programmed to levels 2, 3, and 4 and the right bit cycles through programmed levels 1, 2, 3, and 4. This can be seen in groupings 704, 706 and 708, respectively. More importantly, it can be seen that such shifts may cause some ranges to overlap. For example, there may appear to be some slight overlap (e.g., some 2×distributions (704) overlapping 3×distribution Vt region (706)) between grouping 704 where the left bit is programmed to a level 2 and grouping 706 where the left bit is programmed to a level 3. Thus, a Vt shift in this population of level 3 bits may cause the left bit to be (mis)interpreted as a level 2 when it should be a level 3 or vice versa (e.g., a 2-2 (or 2×) instead of a 3-2 or 3-3 (or 3×) or vice versa).

Figure 8A:
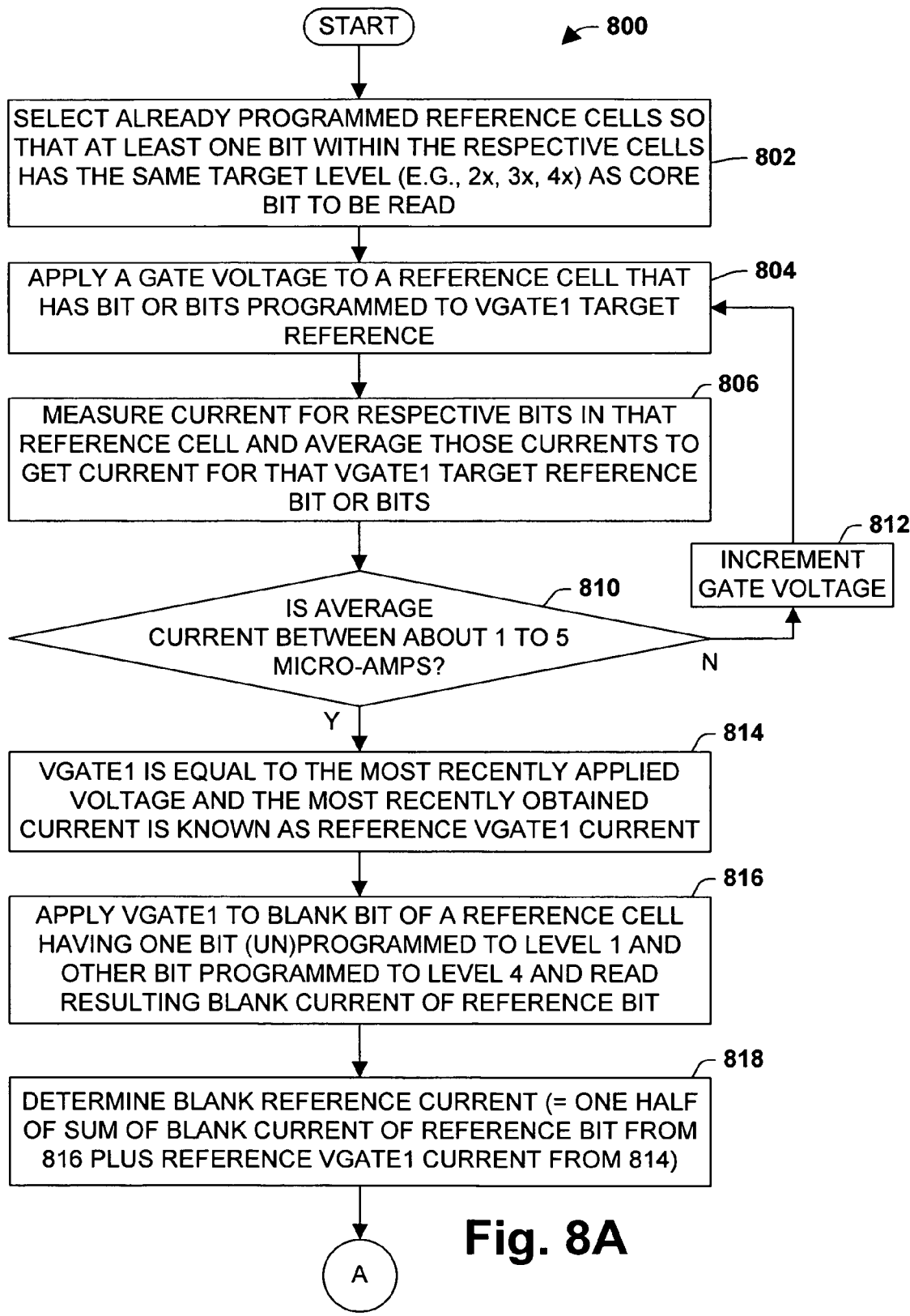
FIGS. 8A, 8B and 8C is a flow diagram illustrating an exemplary technique for reading the level of a bit in a dual sided ONO flash memory cell in accordance with one or more aspects of the present invention.
Figure 8B:
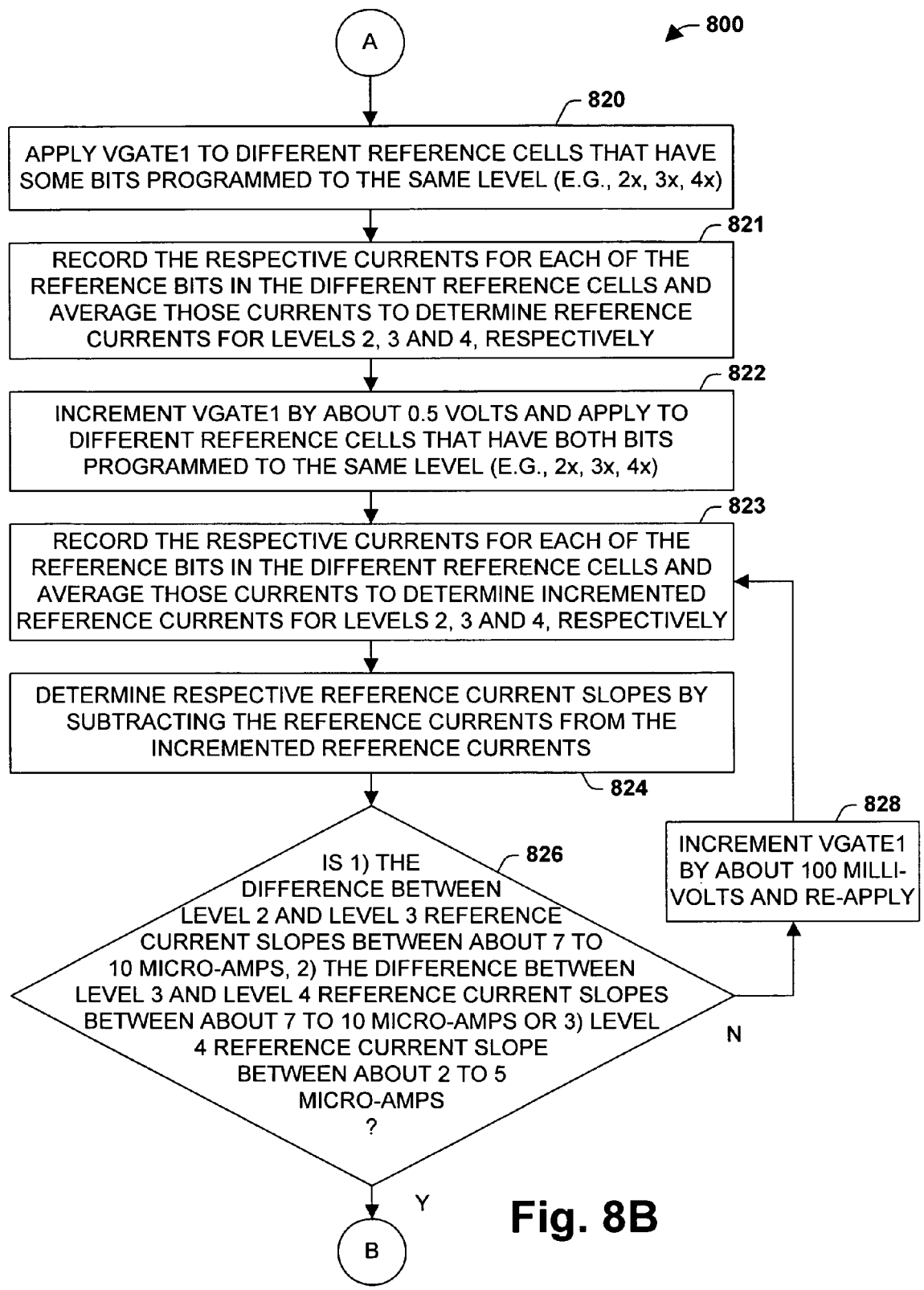
Figure 8C:
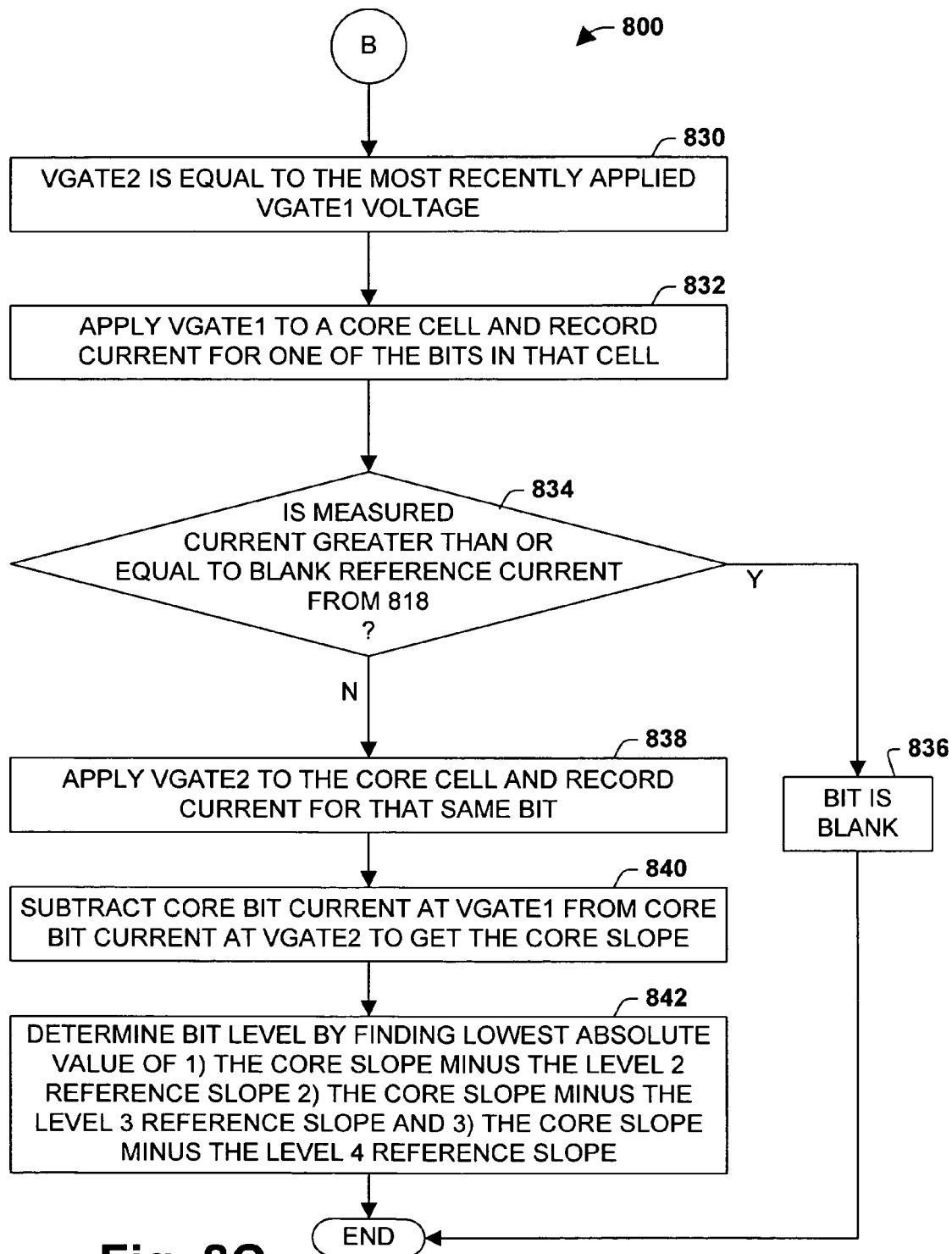

Thus, it can be appreciated that a technique would be desirable that allows the programmed level of bits of a dual sided ONO flash memory cell to be more accurately determined. Turning to FIGS. 8A, 8B and 8C, then, a methodology 800 is illustrated that facilitates determining the programmed level of a bit in a dual sided ONO flash memory cell. It will be appreciated that although the methodology 800 is illustrated and described hereinafter as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

In the methodology, a metric known as transconductance (Gm) is referenced in determining the bit level. Transconductance is utilized because it provides a higher resolution for bit states than other metrics alone, such as drain current, gate voltage, etc. These Gm characterizations are ONO flash dependent and thus are related to the charge profile of the ONO flash. Existing comparison circuits do not work well because of small differences in threshold voltages (Vt's) and drain currents between bit states. By way of further example, drain currents and threshold gate voltages for a read operation may be very small (e.g., on the order of micro-amps and milli-volts, respectively) and may present difficulties in yielding an accurate indication of the amount of stored charge. For instance, uncertainty and/or margins of error may substantially impact on the accuracy of the measurements taken, making it difficult to perform reliable and insightful analyses on the data.

However, changes in drain current as a function of changes in applied gate voltage, which is the transconductance metric, yield a more refined range of data from which more accurate determinations can be made. More particularly, larger differences may exist between different transconductance values that correspond to different bit levels. This makes it easier to more accurately identify the state of a bit. Transconductance (Gm) is a ratio of a change in drain current to a change in gate voltage over a small interval on a drain current versus gate voltage curve, or Gm=$\Delta$Ids/$\Delta$Vgs. As the change in gate voltage becomes smaller and smaller, the value approaches a slope of a line that is tangent to the curve at a specific point. The slope of this line represents the theoretical transconductance for a given gate voltage and drain current.

At the outset, the methodology begins at 802 where a plurality of reference cells have been programmed such that at least one side within the respective dual bit cells are programmed to the same level as the core bit to be read (e.g., to a 2×, 3×, 4×). It is to be appreciated that 1-1 or 1×would generally not be utilized since such a cell is not really programmed, but rather has two un-programmed or blank bits. At 804, a gate voltage is applied to a reference cell that has bit(s) programmed to a vgate1 target reference (e.g., level 2). Then a current reading is taken for the respective bits at 806, and these currents are averaged (provided that the currents are from multiple reference bits programmed to the same level, such as a level 2, for example) to get a vgate1 target current. It will be appreciated that reading currents as referenced herein generally means reading drain to source currents (Ids).

At 810, a determination is made as to whether the vgate1 target reference current is between about 1 to 5 micro-amps. If it is not, then the applied gate voltage is incremented (e.g., by about 0.1 volts) at 812 and the methodology returns to 804 so that a new vgate1 target reference current can be ascertained. If the vgate1 target reference current is determined to be somewhere between about 1 to 5 micro-amps at 810, then the methodology advances to 814 where vgate1 is said to be equal to the voltage that was most recently applied at 804, and the most recently obtained current (e.g., that fell between about 1 to 5 micro-amps) is designated as reference vgate1 current. The methodology then proceeds to 816 wherein vgate1 is applied to the blank bit of a two bit reference cell that has one bit (un)programmed to a level 1 and the other bit programmed to a level 4, and the resulting blank current of the reference bit is read. At 818, a blank reference current is determined by taking one half of the sum of the reference vgate1 current from 814 and the blank current of the reference bit from 816. At this point, there exists a first "coordinate" or reference point for a transconductance determination.

At 820, vgate1 is applied to different reference cells that have some bits programmed to the same level as the core bit to be read. At 821, the currents are recorded for both bits and the respective currents are averaged to get a level 2 reference current, a level 3 reference current and a level 4 reference current. It will be appreciated that multiple two bit cells may be utilized to get these currents. For example, a plurality of 2×cells can be measured and all of their respective currents can be averaged to get the level 2 reference current. Similarly, a plurality of 3× and 4×cells can be utilized to get the level 3 and level 4 reference currents, respectively. At 822, vgate1 is incremented by about 0.5 volts and is applied to reference cells programmed as in 820. In fact, the reference cells used in 822 are the same ones used in 820. Currents are then read from the cells and averaged at 823 as in 821 to get incremented level 2, level 3 and level 4 reference currents for the incremented vgate1.

At 824, respective reference current slopes are determined by subtracting the vgate1 reference currents from 821 for levels 2, 3, and 4 from the incremented level 2, 3 and 4 reference currents from 823. For example, a level 2 reference current slope is determined by subtracting the level 2 reference current from 821 from the incremented level 2 reference current from 823. A determination is then made at 826 as to whether the difference between the level 2 and level 3 reference current slopes is between about 7 to 10 micro-amps, whether the difference between the level 3 and level 4 reference current slopes is between about 7 to 10 micro-amps or whether the level 4 reference current slope is between about 2 to 5 micro-amps. If none of these conditions are true, then the incremented vgate1 is further incremented by about 100 milli-volts at 828 and the methodology returns to 823 so that new reference current slopes can be determined.

At this point, respective transconductance reference values exist for the different bit levels 2, 3 and 4. These are the respective reference current slopes for the different levels that have been determined at 824 by comparing respective changes in drain current as a function of changes in applied voltage. In particular, the Gm values have been determined by obtaining the difference between respective reference currents and corresponding incremented reference currents (e.g., ΔIgs), where the reference currents were obtained at a first threshold voltage (vgate1) and the respective incremented reference currents were obtained at an incremented threshold voltage (incremented vgate1). The determination at 826 attempts to ensure that the respective transconductance reference values or ranges for the different levels are sufficiently separated so that the potential for overlap is mitigated. In this manner, the possibility that a bit will be mis-identified or mis-read becomes rather remote when the metric of transconductance is utilized to identify the bit level (e.g., at 842).

If any one or more of the conditions at 826 are true, then the methodology advances to 830 where vgate2 is said to be equal to the value of the most recently incremented vgate1 applied at 823. It will be appreciated that vgate2 can also be a predetermined constant value that affords sufficient separation between level 2, 3 and 4 reference currents so that the levels may be readily differentiated from one another. In such a situation, reference current slopes/transconductance values can be determined in a manner similar to before, such as by subtracting vgate1 reference current values for the different levels 2, 3 and 4 from vgate2 reference current values for the different levels 2, 3, and 4.

Then, at 832, to read the level of a particular bit in a core memory cell, vgate1 is applied to that cell and the resulting core current is recorded for that bit. At 834, a determination is made as to whether the measured core bit current is greater than or equal to the blank reference current obtained at 818. If so, then at 836, the bit is said to be at a level 1 or blank or un-programmed. If the determination at 834 is not true, then the methodology advances to 838 where vgate2 is applied to the cell and the current is read for the bit of interest. Then, at 840, the core bit current obtained at 832 (where vgate1 was applied to the cell) is subtracted from this vgate 2 current to ascertain the core current slope. In this manner, a transconductance value is obtained for the core bit at 840, namely a change in drain current as a function of a change in applied voltage. More particularly, this value is determined by finding the difference between a drain current obtained at 832 at vgate1 and a drain current obtained at 838 at vgate2.

The level of the bit of interest is then determined at 842 by finding the minimum absolute value of the level 2 reference current slope subtracted from the core current slope, the level 3 reference current slope subtracted from the core current slope and the level 4 reference current slope subtracted from the core current slope. The determination at 842 essentially compares the transconductance for the bit determined at 840 to the respective reference transconductance values determined at 824. The level of the core bit is thus determined by finding the closest reference value, or rather the reference value that yields the smallest difference between the transconductance value for the bit and the reference transconductance value.

Once the value of the bit has been determined, the process can end or be repeated for the other bit in the cell, as well as for bits in other cells. It will be appreciated, however, that only acts 832 through 842 may have to be repeated to determine the value of the virtual ground ONO flash or of other bits in other cells. This is particularly true for the virtual ground ONO flash since variations in cellular composition (that would have an affect on bit performance/charge storage) would likely be very minimal across the same cell. Moreover, the acts leading up to 843 generally pertain to obtaining reference data (e.g., reference transconductance values). Further, finding the reference currents and all the other acts leading up to 843 generally can be repeated for each wordline (e.g., one of 104 core array). Additionally, while the context of the discussion herein has been with regard to bits having four different levels, the present invention has application to any number of different levels. This is particularly true since the number of levels may be considered to be arbitrary and is merely based upon sufficiently detectable differences between amounts of stored charge, where the amount of charge stored generally increases rather gradually along a continuum.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of determining a programmed level of a bit of a core memory cell, comprising:
    making a slope comparison of a core current slope for respective bits of the cell to a plurality of reference current slopes corresponding to possible levels of the bit; and
    determining the level of the bit based upon the slope comparison.

2. The method of claim 1, wherein the slope comparison comprises subtracting the plurality of reference current slopes from the core current slope.

3. The method of claim 2, wherein determining the level of the bit comprises finding the lowest of respective values for the reference current slopes subtracted from the core current slope.

4. The method of claim 3, further comprising:
    making an un-programmed comparison of a core current for the bit of the cell to a blank reference current; and
    determining that the bit is blank if the core current is greater than or equal to the blank reference current.

5. The method of claim 4, further comprising:
    determining the core current slope by:
        applying a first gate voltage (vgate1) to the cell and reading resulting current for the bit;
        applying a second gate voltage (vgate2) to the cell and reading resulting current for the bit; and
        subtracting the core current at vgate1 from the core current at vgate2.

6. The method of claim 5, further comprising:
    determining the reference current slopes by:
        subtracting respective reference currents from corresponding incremented reference currents for the different levels of the bit.

7. The method of claim 6, further comprising:
    determining the respective reference currents by:
        applying vgate1 to multiple reference bits in multiple cells where the bits are programmed to the same level in the cells;
        reading the currents for the bits in the respective cells; and
        averaging the currents for the bits that are programmed to the same level.

8. The method of claim 7, further comprising:
    determining the respective incremented reference currents by:
        applying an incremented vgate1 to multiple reference bits in multiple cells where the bits are programmed to the same level in the cells;
        reading the currents for the bits in the respective cells; and
        averaging the currents for the bits that are programmed to the same level.

9. The method of claim 8, wherein vgate1 is a voltage that produces an average current of between about 1 to 5 micro-amps in a dual bit reference cell that has one or more bits programmed to vgate1 target reference level.

10. The method of claim 9, wherein the current produced by vgate1 is referred to as reference vgate1 current, the method further comprising:
    determining the blank reference current by:
        applying vgate1 to a blank or un-programmed bit of a dual bit reference cell, where the other bit is programmed to a higher level;
        reading resulting blank current from the blank reference bit; and
        taking one half of the sum of the reference vgate1 current and the blank current of the reference bit.

11. The method of claim 10, wherein the bit can have four different levels 1, 2, 3 and 4,
    whereby there is a level 2 average reference current, a level 3 average reference current and a level 4 average reference current,
    wherein vgate2 is a voltage that when applied to the reference cells to produce the average reference currents that yield a level 2 reference current slope, a level 3 reference current slope and a level 4 reference current slope, at least one of the difference between the level 2 and level 3 reference current slopes is between a first current slope difference range, the difference between the level 3 and level 4 reference current slopes is between a second current slope difference range and the level 4 reference current slope is between a level 4 reference current slope range.

12. The method of claim 11, wherein the first current slope difference range about 7 to 10 micro-amps.

13. The method of claim 11, wherein the second current slope difference range is about 7 to 10 micro-amps.

14. The method of claim 11, wherein the level 4 reference current slope range is about 2 to 5 micro-amps.

15. A method of determining the level of a bit in a dual sided ONO flash memory cell that can be one of four different levels; level 1, level 2, level 3 or level 4, the method comprising:
- programming a plurality of dual bit reference cells such that one or both bits within the respective cells are programmed to required levels;
- applying a gate voltage to reference bits programmed to vgate1 target reference level;
- reading respective currents for the bits and averaging these currents to get a vgate1 target reference current;
- determining whether the vgate1 target reference current is between about 1 to 5 micro-amps;
- incrementing and reapplying the applied gate voltage until the vgate1 target reference current is between about 1 to 5 micro-amps if the vgate1 target reference current is not initially between about 1 to 5 micro-amps;
- designating the applied voltage that produces a vgate1 target current between about 1 to 5 micro-amps as vgate1, and calling the produced vgate1 target current that is between about 1 to 5 micro-amps reference vgate1 current;
- applying vgate1 to one or more blank bits of one or more two bit reference cells that have one bit (un)programmed to a level 1 and the other bit programmed to a level 4;
- reading resulting blank current from the blank reference bit;
- determining a blank reference current by taking one half of the sum of the blank current from the blank reference bit and the reference vgate1 target current;
- applying vgate1 to different dual bit reference cells that have some bits programmed to the same level;
- reading respective currents for the bits in each of these cells;
- averaging the respective currents for cells programmed to the same level to get a level 2 reference current, a level 3 reference current and a level 4 reference current;
- incrementing vgate1 by about 0.5 volts and applying to bits from reference cells that are programmed to the same level;
- reading respective currents for both of the bits in each of these cells;
- averaging the respective currents for cells programmed to the same level to get a level 2 incremented reference current, a level 3 incremented reference current and a level 4 incremented reference current;
- determining respective reference current slopes by subtracting the reference currents from the corresponding incremented reference currents
- determining whether any of a first set of conditions are met regarding whether the difference between the level 2 and level 3 reference current slopes is between about 7 to 10 micro-amps, whether the difference between the level 3 and level 4 reference current slopes is between about 7 to 10 micro-amps or whether the level 4 reference current slope is between about 2 to 5 micro-amps;
- incrementing vgate1 by about 100 milli-volts and applying to the dual bit reference cells that have bits programmed to the same level until at least one of the first set of conditions are met if none of the conditions are initially met;
- setting the applied voltage that makes any of the conditions true equal to vgate2;
- applying vgate1 to a dual bit core memory cell that has a bit whose level is to be determined;
- reading a resulting core bit current for the bit whose level is to be determined;
- determining whether a second condition is true regarding whether the core bit current is greater than or equal to the blank reference current;
- designating the bit to be a level 1 or blank if the second condition is true;
- applying vgate2 to the bit if the second conditions is not true;
- reading a resulting current for the bit;
- subtracting the vgate1 core bit current from the core bit current determined by applying vgate2 to the core memory cell to ascertain a core current slope;
- determining the level of the core bit by finding the lowest absolute value resulting from the level 2 reference current slope subtracted from the core current slope, the level 3 reference current slope subtracted from the core current slope and the level 4 reference current slope subtracted from the core current slope.

16. A method of determining a level of a bit of a core dual sided ONO flash memory cell, comprising:
- determining whether the bit is blank or a level 1 by making an un-programmed comparison of a core current for the bit of the cell to a blank reference current corresponding to a situation where a bit is a level 1 or blank in a reference cell and a level 2 reference current corresponding to a situation where a bit is a level 2 in a reference cell; and
- making a slope comparison of a core current slope for the bit to a plurality of reference current slopes corresponding to possible levels of the bit if the bit is not un-programmed; and
- determining the level of the bit based upon the slope comparison.

17. The method of claim 16, wherein the slope comparison comprises subtracting the plurality of reference current slopes from the core current slope.

18. The method of claim 17, wherein determining the level of the bit based upon the slope comparison comprises finding the minimum absolute value of respective difference for the reference current slopes subtracted from the core current slope.

19. The method of claim 16, wherein the un-programmed comparison comprises determining that the bit is blank if the core current is greater than or equal to the blank reference current.

20. A method of determining a programmed level of a bit of a core memory cell, comprising:
- comparing a transconductance value for the bit of the cell to a plurality of reference transconductance values corresponding to possible levels of the bit; and
- determining the level of the bit based upon the comparison.

21. The method of claim 20, wherein the slope comparison comprises subtracting the plurality of reference transconductance values from the transconductance value for the bit and finding a least absolute difference.

22. The method of claim 21, further comprising:
- determining the transconductance value for the bit by subtracting a first drain current for the bit obtained by applying a first gate voltage from a second drain current for the bit obtained by applying a second gate voltage.

23. The method of claim 22, further comprising:
- determining the respective reference transconductance values by subtracting respective first drain currents for reference bits set to the different possible bit levels obtained by applying the first gate voltage from respective second drain currents for the reference bits set to the different possible bit levels obtained by applying the second gate voltage.

* * * * *